(12) United States Patent
Date et al.

(10) Patent No.: US 9,796,179 B2
(45) Date of Patent: *Oct. 24, 2017

(54) LIQUID DISCHARGE APPARATUS, HEAD UNIT, CONTROL UNIT, AND METHOD FOR CONTROLLING LIQUID DISCHARGE APPARATUS

(71) Applicant: Seiko Epson Corporation, Tokyo (JP)

(72) Inventors: Kyohei Date, Nagano (JP); Masashi Kamiyanagi, Matsumoto (JP); Ryota Furukawa, Shiojiri (JP); Kazuhito Fujisawa, Kamiina (JP); Hiroshi Sugita, Setagaya (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/213,513

(22) Filed: Jul. 19, 2016

(65) Prior Publication Data

US 2017/0021615 A1    Jan. 26, 2017

(30) Foreign Application Priority Data

Jul. 23, 2015   (JP) ................................. 2015-145586

(51) Int. Cl.
*B41J 2/045*    (2006.01)
*B41J 2/175*    (2006.01)
(Continued)

(52) U.S. Cl.
CPC ....... *B41J 2/04588* (2013.01); *B41J 2/04541* (2013.01); *B41J 2/04581* (2013.01);
(Continued)

(58) Field of Classification Search
CPC .................................................. B41J 2/04581
See application file for complete search history.

(56) References Cited

U.S. PATENT DOCUMENTS 9,527,279 B2 * 12/2016 Kanzawa ............. B41J 2/04581
2004/0223027 A1   11/2004 Shinkawa et al.
(Continued)

FOREIGN PATENT DOCUMENTS

| CN | 102310633 A | | 1/2012 |
|---|---|---|---|
| JP | 09072755 A | * | 3/1997 |
| JP | 2004-276544 A | | 10/2004 |

OTHER PUBLICATIONS

Machine generated English translation of JP07-072755A to Nakagome, "Circuit for Compensating Temperature Dependency of Signal Value"; obtained via https://www4.j-platpat.inpit.go.jp/eng/tokujitsu/tkbs_en/TKBS_EN_GM101_Top.action on Sep. 1, 2016; 4 pp.*

*Primary Examiner* — Shelby Fidler
(74) *Attorney, Agent, or Firm* — Harness, Dickey & Pierce, P.L.C.

(57) ABSTRACT

A liquid discharge apparatus includes a controller, a drive signal generation unit, a discharge unit, a residual vibration detection unit, and an amplification unit, in which the controller generates discharge control data for controlling discharge of liquid and controls an amplification rate of an amplification unit, the drive signal generation unit generates and outputs a drive signal including a plurality of waveforms driving the discharge unit, the discharge unit discharges the liquid by applying a waveform assigned by the discharge control data among the plurality of waveforms included in the drive signal, the residual vibration detection unit detects residual vibration of the discharge unit and outputs a residual vibration signal indicating the residual vibration, after the discharge unit is driven by the drive signal, and the amplification unit amplifies the residual vibration signal with the amplification rate controlled by the controller and outputs the amplified signal.

5 Claims, 12 Drawing Sheets

(51) Int. Cl.
*B41J 2/165* (2006.01)
*H03G 3/30* (2006.01)
*B41J 2/21* (2006.01)

(52) U.S. Cl.
CPC ....... *B41J 2/04593* (2013.01); *B41J 2/16579* (2013.01); *B41J 2/17566* (2013.01); *B41J 2/2142* (2013.01); *H03G 3/3026* (2013.01)

(56) References Cited

U.S. PATENT DOCUMENTS

| | | | |
|---|---|---|---|
| 2007/0296743 | A1 | 12/2007 | Sakurai |
| 2011/0285773 | A1* | 11/2011 | Shinkawa ............ B41J 2/16579 347/10 |
| 2011/0316915 | A1 | 12/2011 | Matsush Ita |
| 2015/0054876 | A1* | 2/2015 | Nakazawa ........... B41J 2/04581 347/14 |
| 2015/0109057 | A1* | 4/2015 | Rouat ................. H03G 1/0088 330/254 |

* cited by examiner

| SI (SI-H, SI-L) | DRIVE SIGNAL | SP |  |  |  |  |  |  |  |
|---|---|---|---|---|---|---|---|---|---|
| | | St0 | St1 | St2 | St3 | St4 | St5 | St6 | St7 |
| (0, 0) | W0 | P00 | P10 | P20 | P30 | P40 | P50 | P60 | P70 |
| (0, 1) | W1 | P01 | P11 | P21 | P31 | P41 | P51 | P61 | P71 |
| (1, 0) | W2 | P02 | P12 | P22 | P32 | P42 | P52 | P62 | P72 |
| (1, 1) | W3 | P03 | P13 | P23 | P33 | P43 | P53 | P63 | P73 |

| SI (SI-H, SI-L) | DRIVE SIGNAL | SP | | | | | | | |
|---|---|---|---|---|---|---|---|---|---|
| | | St0 | St1 | St2 | St3 | St4 | St5 | St6 | St7 |
| (0, 0) | W0 | P00 | P10 | P20 | P30 | P40 | P50 | P60 | P70 |
| (0, 1) | W1 | P01 | P11 | P21 | P31 | P41 | P51 | P61 | Gt0 |
| (1, 0) | W2 | P02 | P12 | P22 | P32 | P42 | P52 | P62 | Gt1 |
| (1, 1) | W3 | P03 | P13 | P23 | P33 | P43 | P53 | P63 | Gt2 |

FIG. 15

⟨SETTING CONTENT BY SETTING DEVICE⟩

| (Gt0, Gt1, Gt2) | H LEVEL (TURNED ON SWITCH) | Ra | Rb |
|---|---|---|---|
| (0, 0, 0) | D000 (Sw0) | R0 | R1+R2+R3+R4+R5+R6+R7+R8 |
| (0, 0, 1) | D001 (Sw1) | R0+R1 | R2+R3+R4+R5+R6+R7+R8 |
| (0, 1, 0) | D010 (Sw2) | R0+R1+R2 | R3+R4+R5+R6+R7+R8 |
| (0, 1, 1) | D011 (Sw3) | R0+R1+R2+R3 | R4+R5+R6+R7+R8 |
| (1, 0, 0) | D100 (Sw4) | R0+R1+R2+R3+R4 | R5+R6+R7+R8 |
| (1, 0, 1) | D101 (Sw5) | R0+R1+R2+R3+R4+R5 | R6+R7+R8 |
| (1, 1, 0) | D110 (Sw6) | R0+R1+R2+R3+R4+R5+R6 | R7+R8 |
| (1, 1, 1) | D111 (Sw7) | R0+R1+R2+R3+R4+R5+R6+R7 | R8 |

LIQUID DISCHARGE APPARATUS, HEAD UNIT, CONTROL UNIT, AND METHOD FOR CONTROLLING LIQUID DISCHARGE APPARATUS

The entire disclosure of Japanese Patent Application No. 2015-145586, filed Jul. 23, 2015 is expressly incorporated by reference herein.

BACKGROUND

1. Technical Field

The present invention relates to a liquid discharge apparatus, a head unit, a control unit, and a method for controlling the liquid discharge apparatus.

2. Related Art

An ink jet printer for printing images and documents by using a piezoelectric element (for example, piezo element) as a discharge unit that discharges liquid such as ink and the like, is known. The piezoelectric element is provided in a head unit so as to correspond to each of a plurality of nozzles, and configured to discharge a predetermined amount of ink (liquid) at predetermined timing from the nozzle by driving each of the plurality of nozzles according to a drive signal.

In this configuration, when the viscosity of ink is increased (thickened) within a discharge unit, abnormal discharge is generated, and the quality of images to be printed is reduced. In addition, when bubble is included in the ink within the discharge unit, abnormal discharge is generated, and similarly, the quality of image to be printed is reduced.

Accordingly, in order to realize high-quality printing, technology of detecting residual vibration generated after the piezoelectric element is driven, and of inspecting a discharge state of the ink by the discharge unit by analyzing a residual vibration signal indicating the residual vibration, is proposed (for example, see JP-A-2004-276544).

However, amplitude of the residual vibration is changed according to a usage situation and environment of a printer. Therefore, there is a case where a discharge state of ink by the discharge unit cannot be accurately determined due to an adverse effect in analysis of the residual vibration signal.

SUMMARY

An advantage of some aspects of the invention is to provide technology capable of increasing the accuracy of determination in the discharge state of ink, without adversely affecting the analysis of the residual vibration signal, even when the amplitude of the residual vibration is changed.

According to an aspect of the invention, there is provided a liquid discharge apparatus including a controller; a drive signal generation unit; a discharge unit; a residual vibration detection unit; and an amplification unit, in which the controller generates discharge control data for controlling discharge of liquid and controls an amplification rate of an amplification unit, the drive signal generation unit generates and outputs a drive signal including a plurality of waveforms driving a discharge unit, the discharge unit discharges the liquid by applying a waveform assigned by the discharge control data among the plurality of waveforms included in the drive signal, the residual vibration detection unit detects residual vibration of the discharge unit and outputs a residual vibration signal indicating the residual vibration, after the discharge unit is driven by the drive signal, and the amplification unit amplifies the residual vibration signal with the amplification rate controlled by the controller and outputs the amplified signal.

According to the liquid discharge apparatus of the aspect, even when a usage situation, environment, or the like of the apparatus is changed, it is possible to change an amplification rate of the residual vibration signal according to the change. Therefore, it is possible to improve the accuracy of determination of a discharge state.

In the liquid discharge apparatus according to the aspect, the amplification unit may include an operational amplifier that amplifies the residual vibration signal with an amplification rate according to a resistor ratio of a first resistor and a second resistor, and a setting unit that sets the resistor ratio by the gain data.

In this case, each of the first resistor and the second resistor may include a plurality of resistor elements, and the setting unit may set the resistor ratio by changing the number of resistor elements included in at least one of the first resistor and the second resistor. For example, a configuration or the like in which the plurality of resistor elements are connected in series and any of the connection points is fed back to an operational amplifier, may be considered in order to change the number of a plurality of resistor elements.

The liquid discharge apparatus according to the aspect may further include a temperature measurement unit that measures the temperature of a head unit. The controller may generate gain data with an amplification rate according to the temperature measured by the temperature measurement unit. With this, even when amplitude of the residual vibration is changed by changing the viscosity of liquid for temperature, it is possible to appropriately set the amplification rate.

In addition, in the liquid discharge apparatus according to the aspect, the controller may generate gain data with an amplification rate according to a type of the liquid discharged from the discharge unit. With this, even when amplitude of the residual vibration is changed by changing a type of the liquid, it is possible to appropriately set the amplification rate.

The liquid discharge apparatus may be an apparatus that discharges the liquid, and may also include a stereolithography apparatus (so-called 3D printer), a textile printing apparatus, or the like, in addition to a printing apparatus described below.

In addition, the invention is not limited to the liquid discharge apparatus, may be implemented in various aspects, and may be implemented as a head unit or a control unit constituting the liquid discharge apparatus, a method for controlling the liquid discharge apparatus, or the like.

BRIEF DESCRIPTION OF THE DRAWINGS

The invention will be described with reference to the accompanying drawings, wherein like numbers reference like elements.

FIG. 15 is a diagram of an equivalent circuit illustrating a configuration of the amplification unit.

DESCRIPTION OF EXEMPLARY EMBODIMENTS

Hereinafter, a printing apparatus will be described as an example in an embodiment of the invention with reference to accompanying drawings.

Liquid Discharge Apparatus According to Embodiment

Figure 1:
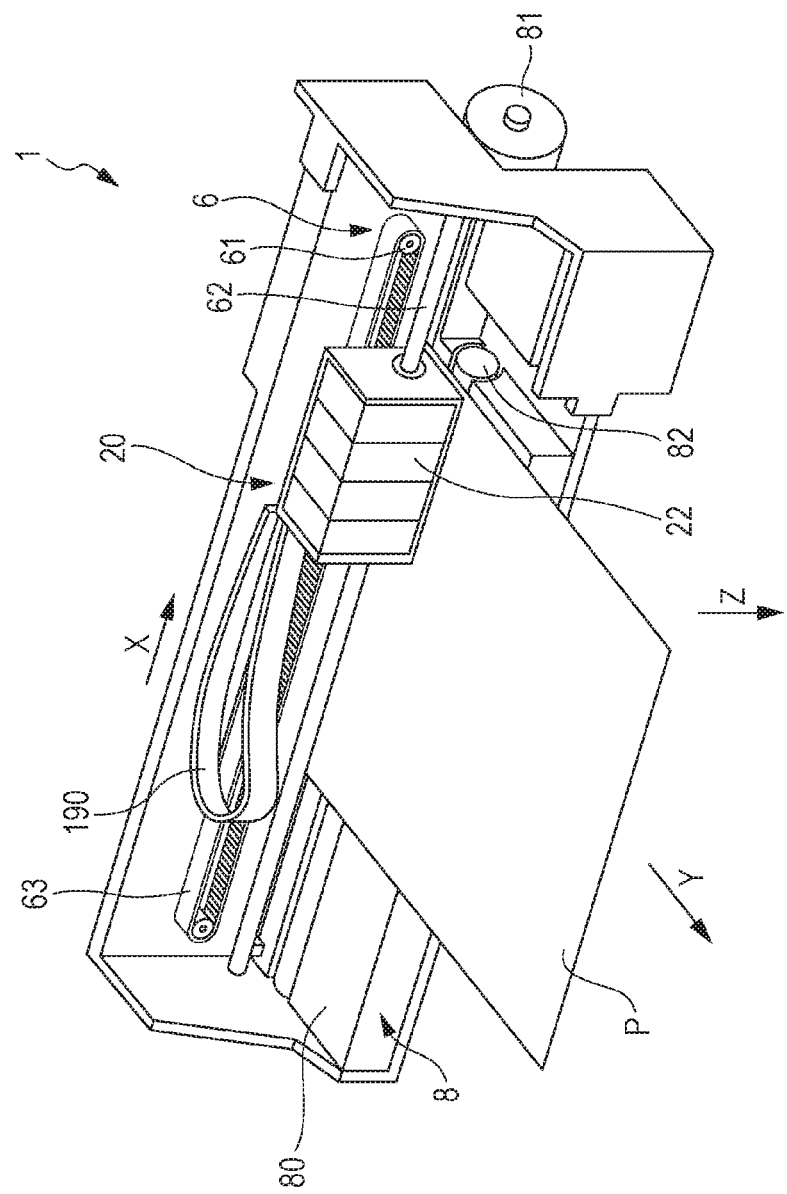
FIG. 1 is a diagram illustrating a schematic configuration of a printing apparatus according to an embodiment.

FIG. 1 is a perspective view illustrating a schematic configuration of a printing apparatus.

A printing apparatus 1 is a type of a liquid discharge apparatus that forms an ink dot group on a medium P, such as paper or the like, by discharging ink as liquid, and, with this, prints images (including characters, graphics, or the like).

As illustrated in FIG. 1, the printing apparatus 1 includes a moving mechanism 6 that moves (reciprocates) a carriage 20 in a main scanning direction (X direction).

The moving mechanism 6 includes a carriage motor 61 that moves the carriage 20, a carriage guide shaft 62 of which both ends are fixed, and a timing belt 63 extended substantially parallel to the carriage guide shaft 62 and driven by the carriage motor 61.

The carriage 20 is supported by the carriage guide shaft 62 so as to freely reciprocate, and fixed to a portion of the timing belt 63. Therefore, when the timing belt 63 is moved in forward and reverse directions by the carriage motor 61, the carriage 20 reciprocates by being guided by the carriage guide shaft 62.

A print head 22 is mounted on the carriage 20. A portion of the print head 22 facing the medium P includes a plurality of nozzles that individually discharge ink in a Z direction. The print head 22 is divided into schematically four blocks for color printing. Ink cartridges of black (Bk), cyan (C), magenta (M), and yellow (Y) are respectively mounted in the blocks, and discharge ink of respective colors from the nozzles.

The carriage 20, to which various signals and data including the drive signal are supplied from a control unit (omitted in this drawing) through a flexible flat cable 190, is configured.

The printing apparatus 1 includes a transport mechanism 8 that transports the medium P on a platen 80. The transport mechanism 8 includes a transport motor 81 that is a drive source, and a transport roller 82 that is rotated by the transport motor 81 and transfers the medium P in a sub-scanning direction (Y direction).

In this configuration, ink is discharged according to dot formation data described below from nozzles of the print head 22 in accordance with main scanning of the carriage 20, and images are formed on a surface of the medium P by repeating operation transferring the medium P by the transport mechanism 8.

The main scanning in this embodiment is performed by moving the carriage 20. However, the main scanning may be performed by moving the medium P, and by moving both the carriage 20 and the medium P. That is, a configuration in which the medium P and the carriage 20 (the print head 22) are relatively moved may be implemented.

Figure 2:
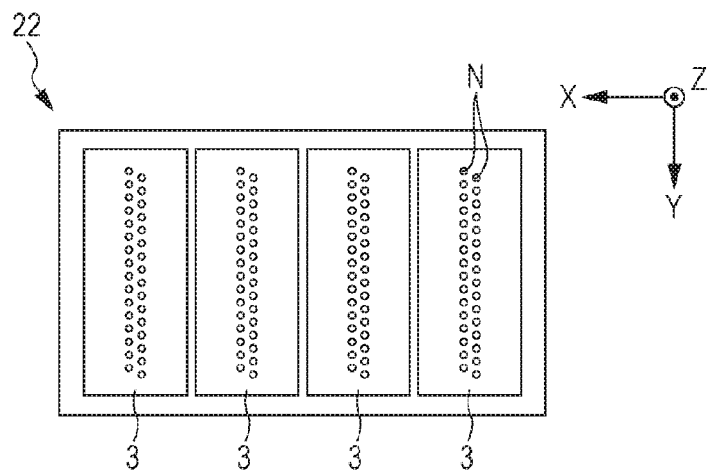
FIG. 2 is a diagram illustrating an example of a discharge surface of ink in a print head.

FIG. 2 is a diagram of a case where a discharge surface of ink in the print head 22 is viewed from the medium P. As illustrated in this drawing, the print head 22 includes four head units 3. The four head units 3 correspond to black (Bk), cyan (C), magenta (M), and yellow (Y), respectively, and are arranged along with an X direction that is the main scanning direction.

Figure 3:
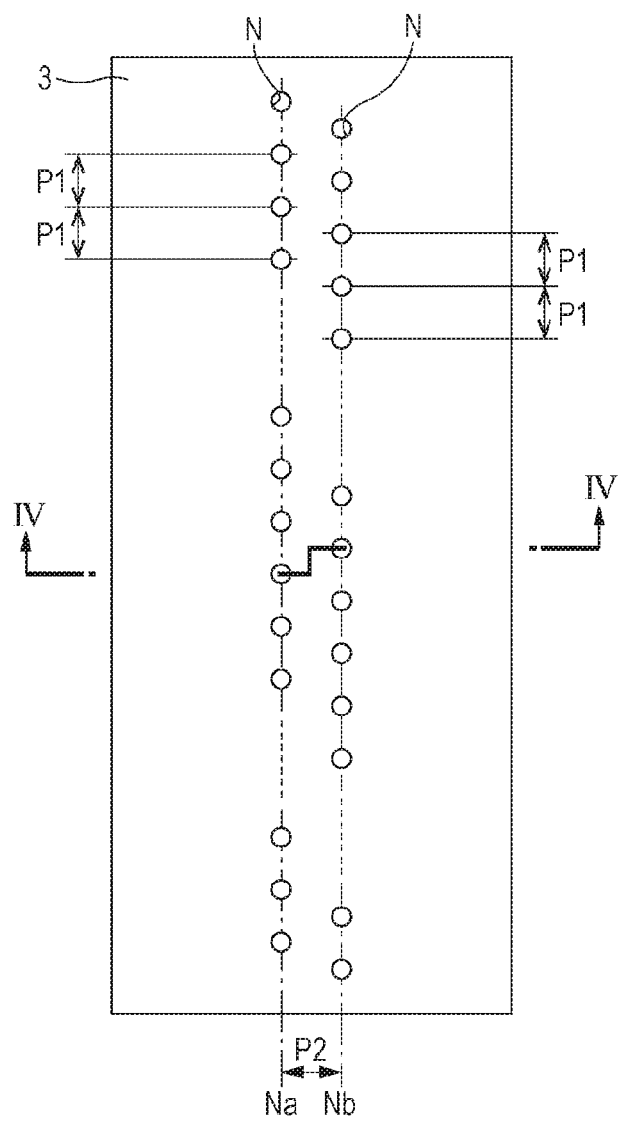
FIG. 3 is a diagram illustrating arrangement or the like of nozzles in a head unit.

FIG. 3 is a diagram illustrating arrangement of the nozzles in one head unit 3.

As illustrated in this drawing, a plurality of nozzles N are arranged in two rows in one head unit 3. Here, the two rows are referred to as the nozzle arrays Na and Nb for the convenience of explanation.

In the nozzle arrays Na and Nb, a plurality of nozzles N are arranged at a pitch P1 in the Y direction. In addition, the nozzle arrays Na and Nb are spaced apart by a pitch P2 in the X direction. A nozzle N included in the nozzle array Na and a nozzle N included in the nozzle array Nb, have a relationship in which the nozzles are disposed to shift by half of the pitch P1 in the Y direction.

In this manner, since the nozzle N is arranged by shifting by half of the pitch P1 in the Y direction in the two rows of the nozzle arrays Na and Nb, resolution in the Y direction can be substantially improved two times compared to a case of one row.

For the convenience of explanation, the number of nozzles N in one head unit 3 is considered to be "400" in each of the nozzle arrays Na and Nb, and is considered to be a total of "800" in two rows. In addition, there is a case where nozzles are conveniently described by applying nozzle numbers to distinguish the nozzle N. Specifically, there is a case where the nozzles are arranged as "1", "2", . . . , "400" in order from an upper side in the nozzle array Na, and as "401", "402", . . . , "800" in order from an upper side in the nozzle array Nb, in the drawing.

The head unit 3 is configured to connect a flexible circuit substrate to an actuator substrate described below and to mount a drive IC on the flexible circuit substrate. Accordingly, a structure of the actuator substrate will be described.

Figure 4:
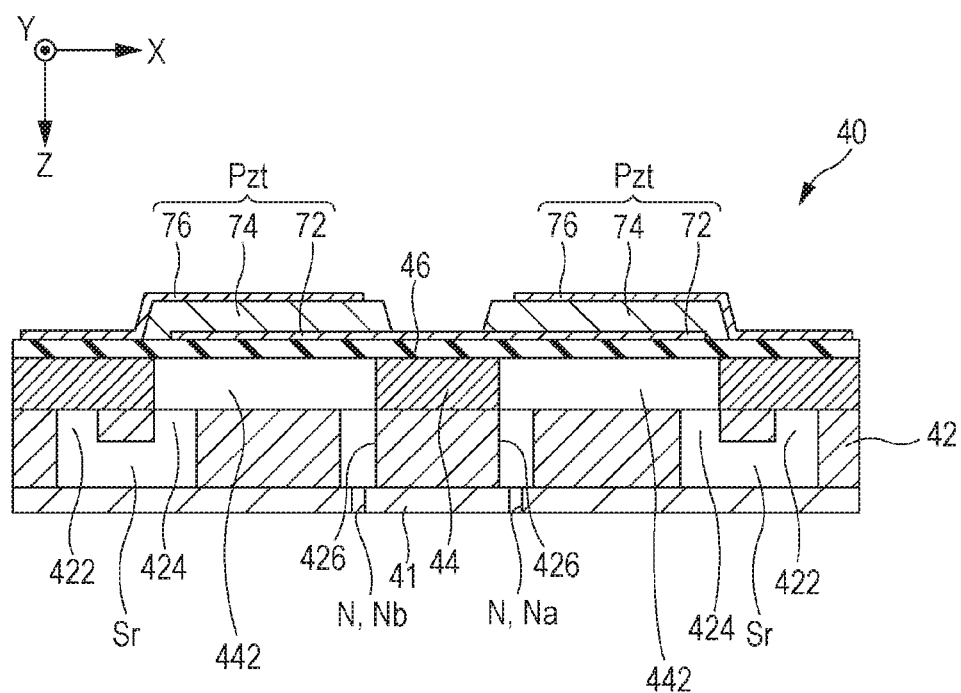
FIG. 4 is a sectional view illustrating a main configuration in the head unit.

FIG. 4 is a sectional view illustrating a structure of the actuator substrate. Specifically, FIG. 4 is a view illustrating a cross section taken along line IV-IV in FIG. 3.

As illustrated in FIG. 4, an actuator substrate 40 is a structural body in which a pressure chamber substrate 44 and a vibration plate 46 are provided on a surface on a negative side in the Z direction of a flow path substrate 42, and a nozzle plate 41 is provided on a surface on a positive side in the Z direction.

Respective components of the actuator substrate 40 are substantially flat plate type members long in the Y direction, and fixed to each other by using, for example, an adhesive.

In addition, for example, the flow path substrate and the pressure chamber substrate 44 are formed of a silicon single crystal substrate.

The nozzle N is formed in the nozzle plate 41. A structure corresponding to nozzles included in the nozzle array Na and a structure corresponding to nozzles included in the nozzle array Nb are in a relationship in which the nozzles are shifted by half of the pitch P1 in the Y direction. However, since the nozzles are approximately symmetrically formed other than the relationship, a structure of the actuator substrate 40 will be described in view of the nozzle array Na in the following.

The flow path substrate 42 is a flat plate that forms a flow path of ink, and configured with an opening portion 422, a supply flow path 424, and a communication flow path 426. A structure in which the supply flow path 424 and the communication flow path 426 are formed for every nozzle, and the opening portion 422 is formed to be continuous over a plurality of nozzles, and is supplied with ink of a corresponding color, is configured. The opening portion 422 functions as a liquid storage chamber Sr, and a bottom surface of the liquid storage chamber Sr is configured with, for example, the nozzle plate 41. Specifically, the nozzle plate 41 is fixed on a bottom surface of the flow path substrate 42 so as to block the opening portion 422, each of the supply flow paths 424, and the communication flow path 426 in the flow path substrate 42.

The vibration plate 46 is installed on a surface opposite side to the flow path substrate 42 in the pressure chamber substrate 44. The vibration plate 46 is a flat plate member capable of elastically vibrating, and, for example, configured by laminating an elastic film formed of elastic material such as silicon oxide, and the like and an insulating film formed of insulating material such as zirconium oxide, and the like. The vibration plate 46 and the flow path substrate 42 face each other with an interval inside of each of the opening portions 422 in the pressure chamber substrate 44. Space pinched between the flow path substrate 42 and the vibration plate 46 in the opening portion 422 functions as a cavity 442 that applies pressure to ink. Each of the cavities 442 is communicated to the nozzle N through the communication flow path 426 of the flow path substrate 42.

Piezoelectric elements Pzt are formed for every nozzle N (cavity 442) on a surface opposite side to the pressure chamber substrate 44 in the vibration plate 46.

The piezoelectric element Pzt includes a common drive electrode 72 over a plurality of piezoelectric elements Pzt formed on a surface of the vibration plate 46, a piezoelectric body 74 formed on a surface of the drive electrode 72, and an individual drive electrode 76 formed for every piezoelectric element Pzt on a surface of the piezoelectric body 74. In this configuration, a region in which the piezoelectric body 74 is pinched by the facing drive electrodes 72 and 76 functions as the piezoelectric element Pzt.

The piezoelectric body 74 is formed at processing including, for example, heating treatment (burning). Specifically, piezoelectric material coated on a surface of the vibration plate 46 on which a plurality of the drive electrode 72 are formed is processed by molding (for example, milling using plasma) through heating treatment by heat treatment in a firing furnace for each of the piezoelectric elements Pzt, such that the piezoelectric body 74 is formed.

Similarly, the piezoelectric element Pzt corresponding to the nozzle array Nb is also configured to include the drive electrode 72, the piezoelectric body 74, and the drive electrode 76.

In addition, in the piezoelectric body 74 of this example, the common drive electrode 72 is configured as a lower layer and the individual drive electrode 76 is configured as an upper layer. However, on the contrary, the drive electrode 72 may be configured as the upper layer and the drive electrode 76 may be configured as the lower layer.

The drive IC may be directly mounted on the actuator substrate 40.

As described below, a drive signal according to the amount of ink to be discharged is individually applied to the drive electrode 76 that is one end of the piezoelectric element Pzt. Meanwhile, a holding signal of the voltage $V_{BS}$ is commonly applied to the drive electrode 72 that is the other end of the piezoelectric element Pzt. Therefore, the piezoelectric element Pzt is displaced in an upward or downward direction according to a voltage applied to the drive electrodes 72 and 76. Specifically, when a voltage of the drive signal applied through the drive electrode 76 is low, a center portion of the piezoelectric element Pzt is flexed in the upward direction with respect to both end portions. Meanwhile, when a voltage Vout is high, the center portion is flexed in the downward direction.

Here, when flexing in the upward direction, since the internal volume of the cavity 442 is enlarged (pressure decreases), the ink is drawn from the liquid storage chamber Sr. Meanwhile, when flexing in the downward direction, since the internal volume of the cavity 442 is reduced (pressure increases), ink droplets are discharged from the nozzles N depending on the degree of the reduction. In this manner, when an appropriate drive signal is applied to the piezoelectric element Pzt, the ink is discharged from the nozzle N by the displacement of the piezoelectric element Pzt. Therefore, a discharge unit discharging the ink is configured by at least the piezoelectric element Pzt, the cavity 442, and the nozzle N.

Next, an electrical configuration of the printing apparatus 1 will be described.

Figure 5:
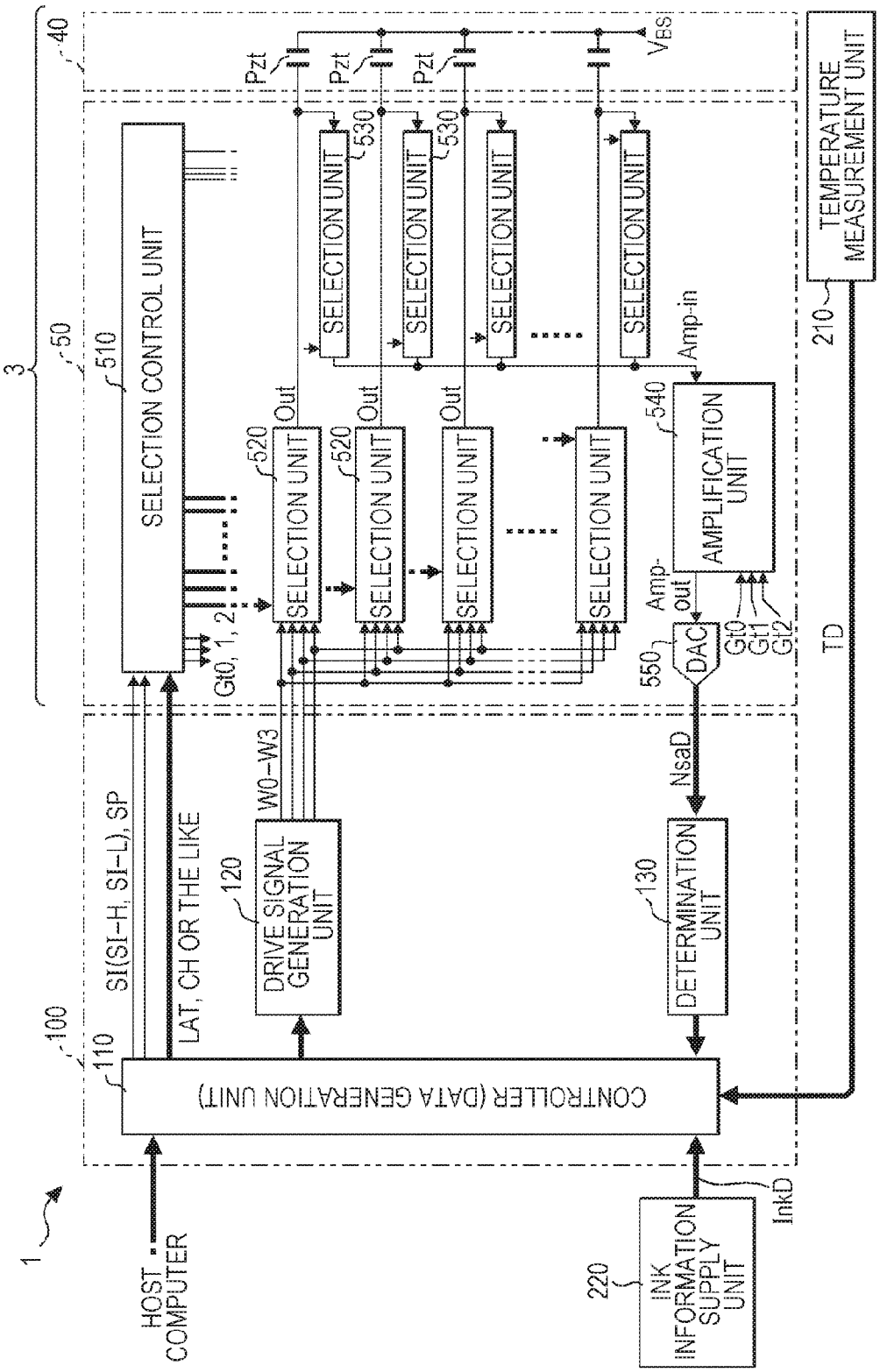
FIG. 5 is a block diagram illustrating an electrical configuration of the printing apparatus.

FIG. 5 is a block diagram illustrating an electrical configuration of the printing apparatus 1.

As illustrated in this drawing, the printing apparatus 1 is configured such that the head unit 3 is connected to the control unit 100. The head unit 3 is schematically divided into the actuator substrate 40 and a drive IC 50.

The control unit 100 includes a controller 110, a drive signal generation unit 120, and a determination unit 130. Among these, the controller 110 is a type of a microcomputer including CPU, RAM, ROM, and the like, and outputs various signals, data, and the like to control respective units by executing a predetermined program when image data for defining images to be formed on the medium P is supplied from a host computer.

Specifically, the controller 110 generates discharge control data, control signals, and the like, and outputs the generated data and signals to the drive IC 50 in synchronization with control for the moving mechanism 6 and the transport mechanism 8 (omitted in FIG. 5). The dot formation data SI and the waveform selection data SP are included in the discharge control data.

Among the data, the dot formation data SI is data for defining the amount of ink discharged from each of nozzles N as, for example, two bits, in other words, data for selecting any one among four drive signals (will be described below). As described above, in this example, since the number of nozzles in one head unit 3 is "800", the dot formation data SI required in one printing cycle is a total of 1600 bits.

In addition, the waveform selection data SP is data for defining whether or not the selected drive signal is applied to the piezoelectric element Pzt in each of states (periods) in the printing cycles. That is, the waveform selection data is data for defining a relationship between the dot formation data and the drive signal.

In this example, in a case where the number of drive signals is "4" and the number of the state is "8", the waveform selection data SP becomes 32 bits. In addition, in this example, in a case where an amplification rate is set in an amplification unit described below, a part of the waveform selection data SP of the 32 bits described below is replaced into gain data for defining the amplification rate.

The drive signal generation unit 120 generates four drive signals W0 to W3 and outputs the generated signals to the drive IC 50, under the control of the controller 110. An example of the drive signals will be described.

The determination unit 130 analyzes data NsaD supplied from the drive IC 50, that is, as described below, data NsaD converted from a signal indicating residual vibration in digital conversion manner by, for example, fast Fourier transform (FFT), or the like, and determines a state of the discharge unit, especially, a discharge state of the ink. The determination unit 130, for example, previously stores typical states such as normal, nozzle clogging, bubble generation, and the like with respect to a result obtained from the FFT (spectrum), compares a processing result of the data NsaD and the stored states, determines a match state or a state close to the match as a state of the discharge unit, and notifies the controller 110 of the determined result.

Meanwhile, in the head unit 3, the drive IC 50 includes a selection control unit 510, a pair of selection units 520 and 530 corresponding one-to-one to the piezoelectric element Pzt, an amplification unit 540, and a DAC 550. Among these, the selection control unit 510 controls selection in each of the selection units 520 and 530.

Specifically, firstly, the selection control unit 510 accumulates the dot formation data SI among discharge control data supplied in synchronization with a clock signal (not illustrated) from the controller 110 in a shift register by the number of nozzles (piezoelectric element Pzt) of the head unit 3. Second, the selection control unit 510 transfers the dot formation data accumulated in the shift register to a latch circuit, and latches the dot formation data, when a control signal LAT is input.

Third, when considering a certain nozzle, the selection control unit 510 selects any one among the drive signals W0 to W3 according to the dot formation data SI latched in accordance with the nozzle, and applies (or does not apply) the selected drive signal to one end of a piezoelectric element Pzt corresponding to the nozzle in accordance with the waveform selection data SP in each state. Fourth, in a case where gain data is included in the waveform selection data SP, the selection control unit 510 latches the gain data when the control signal LAT is input. In this example, when it is assumed that amplification rates of the amplification unit 540 are 8 steps, the gain data is three bits. The three bits are referred to as Gt0, Gt1, and Gt2 so as to distinguish the three bits. In addition, fifth, in a case of inspecting a state of the discharge unit, the selection control unit 510 controls turning on and turning off of the selection unit 530 corresponding to a nozzle of an inspection target.

The shift register, and the latch circuit, or the like are not illustrated.

Each of the selection units 520 selects (or, none of which is selected) one of the drive signals W0 to W3 according to an instruction by the selection control unit 510, and applies the selected signal to one end of a corresponding piezoelectric element Pzt as a drive signal of a voltage Out.

Figure 6:
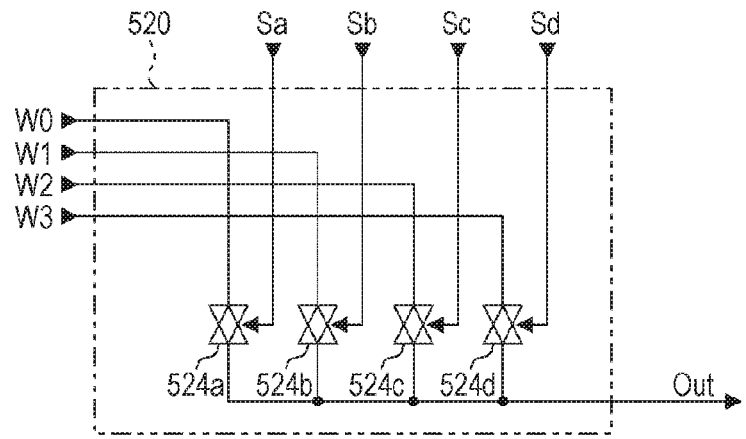
FIG. 6 is a diagram illustrating a configuration of a selection unit.

FIG. 6 is a diagram illustrating a configuration of the selection unit 520 in FIG. 5.

As illustrated in this drawing, the selection unit 520 includes transfer gates 524a, 524b, 524c, and 524d. Selection signals Sa, Sb, Sc, and Sd are supplied to one selection unit 520 from the selection control unit 510. Among the signals, the selection signal Sa is supplied to a control terminal of the transfer gate 524a. Similarly, the selection signal Sb is supplied to a control terminal of the transfer gate 524b, the selection signal Sc is supplied to a control terminal of the transfer gate 524c, and the selection signal Sd is supplied to a control terminal of the transfer gate 524d.

The drive signal W0 is supplied to an input terminal of the transfer gate 524a, the drive signal W1 is supplied to an input terminal of the transfer gate 524b, the drive signal W2 is supplied to an input terminal of the transfer gate 524c, and the drive signal W3 is supplied to an input terminal of the transfer gate 524d.

Output terminals of the transfer gates 524a, 524b, 524c, and 524d are commonly connected to one end of a corresponding piezoelectric element Pzt.

The transfer gate 524a conducts (turns on) between an input terminal and an output terminal thereof, when the selection signal Sa is an H level, and the transfer gate 524a does not conduct (turns off) between the input terminal and the output terminal thereof, when the selection signal Sa is an L level. Similarly, the transfer gates 524b, 524c, and 524d turn on and off between the input terminal and the output terminal thereof according to selection signals Sb, Sc, and Sd.

A connection point of output terminals of the transfer gates 524a, 524b, 524c, and 524d, that is, the voltage of an output terminal is represented as Out.

Returning to FIG. 5 again, the selection unit 530 is a switch which is provided to correspond to each of the piezoelectric elements Pzt and of which turning on and off between the input terminal and the output terminal is controlled by the selection control unit 510. Each of input terminals of the selection units 530 is connected to one end of a corresponding piezoelectric element Pzt and output terminals thereof are commonly connected to an input terminal of the amplification unit 540.

Only a selection unit corresponding to a discharge unit selected as an inspection target is controlled to be turned on in a specific state (period) among a plurality of the selection units 530. In addition, a signal of an output terminal of the selection unit 530, that is, a signal input to the amplification unit 540 is conveniently represented as Amp-in.

The amplification unit 540 amplifies a signal Amp-in with an amplification rate (gain) defined by gain data Gt0 to Gt2, and outputs the amplified signal as a signal Amp-out. The amplification unit 540 will be described in detail.

A digital to analog converter (DAC) 550 converts the signal Amp-out into digital data NsaD, and outputs the converted digital data.

As described above, one of the piezoelectric elements Pzt is provided for each nozzle N on the actuator substrate 40. The voltage Out of the drive signal is applied to one end of each of the piezoelectric elements Pzt connected to an output terminal of corresponding selection unit 520 and to an input terminal of the selection unit 530 for detecting residual vibration. A voltage $V_{BS}$ is supplied to the other ends of each of the piezoelectric elements Pzt which are commonly connected to each other.

A temperature measurement unit 210 mounted on the actuator substrate 40 measures the temperature of ink supplied to the discharge unit, particularly, the cavity 442 (see FIG. 4), and outputs temperature data TD indicating the measured result to the controller 110.

Meanwhile, an ink information supply unit 220 obtains ink information of an ink cartridge mounted on the print head 22, for example, information InkD such as color, production lot, and the like, and outputs the obtained information to the controller 110. Specifically, the ink information InkD is information relating to a type of the ink (color and production lot) or the like, and particularly, information associated with the viscosity of ink. It is possible to use various methods in which, for example, the ink information supply unit 220 obtains the ink information InkD by communicating with an IC chip mounted on the cartridge, the ink information InkD is obtained by reading a barcode attached to the ink cartridge, or the like.

The controller 110 outputs gain data Gt0 to Gt2 corresponding to the temperature data TD and the ink information InkD. Specifically, a two-dimensional table (look-up table) storing the gain data Gt0 to Gt2 corresponding to temperature and the viscosity of ink is previously created, and the controller 110 reads the gain data Gt0 to Gt2 corresponding to the temperature indicated by the temperature data TD and the viscosity of ink defined by the ink information InkD, when the temperature data TD and the ink information InkD are input.

The controller 110 supplies the gain data Gt0 to Gt2 to the drive IC 50 as a part of waveform selection data SP described below.

Next, discharge control data including the dot formation data SI and the waveform selection data SP, and each state in printing cycles will be described.

Figure 7:
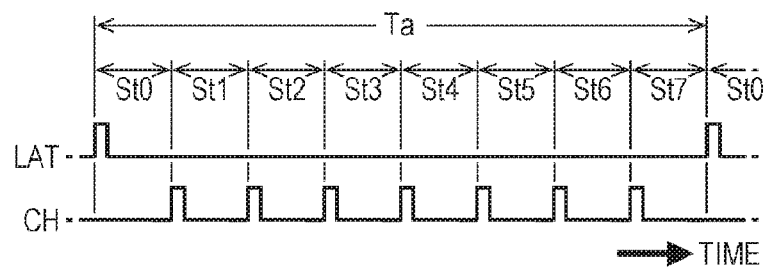
FIG. 7 is a diagram for explaining content of discharge control data.
Figure 8:
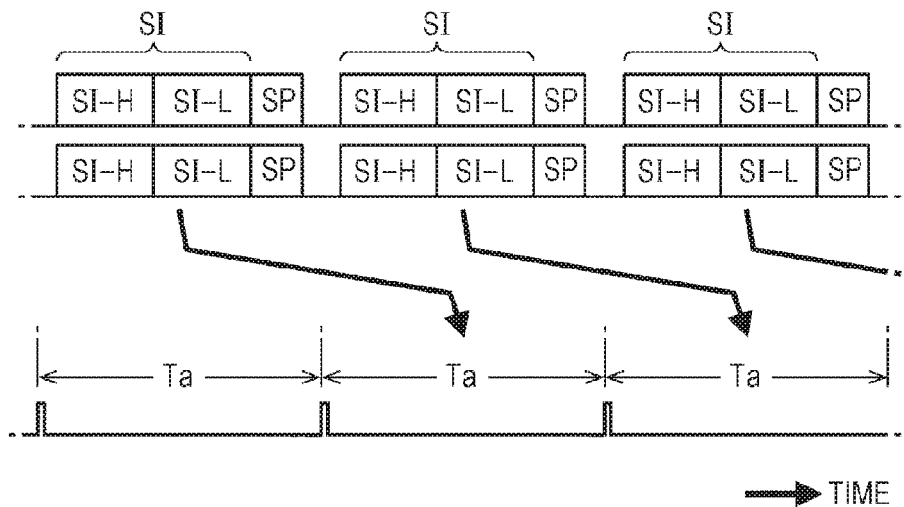
FIG. 8 is a diagram illustrating transfer of the discharge control data.

FIG. 7 is a diagram for explaining content of discharge control data or the like. FIG. 8 is a diagram illustrating transfer timing of the discharge control data output from the controller 110. In this example, first, printing operation will be described, and determination of the residual vibration will be conveniently described later.

As illustrated in FIG. 7, a printing cycle Ta is divided into eight states (periods) St0 to St7. Here, the printing cycle Ta is a period required for forming one dot in printing operation. In the printing operation, a pulse of the control signal LAT is input at a start time of the printing cycle Ta, and sequentially a next pulse of the control signal CH is input. Starting of the printing cycle Ta (state St0) is defined according to the input of the control signal LAT, and starting of states St1 to St7 is defined according to input of successive control signals CH.

Here, the discharge control data for defining dots to be printed during the printing cycle Ta is supplied from the controller 110 to the selection control unit 510 before the control signal LAT defining starting of a certain printing cycle Ta. Specifically, as illustrated in FIG. 8, the discharge control data is supplied by being serialized in two lines (details will be described). Furthermore, for example, in each line, the dot formation data SI is first supplied, and then the waveform selection data SP is supplied. In addition, for example, the higher bits SI-H are first supplied and then the lower bits SI-L are supplied, for the dot formation data SI of two bits.

The discharge control data supplied in this order is stored in a shift register, or the like in the selection control unit 510. The dot formation data SI of two bits is transferred by the control signal LAT to the latch circuit corresponding one-to-one to the nozzle, and latched. The waveform selection data SP is also transferred by the control signal LAT from the shift register to the latch circuit, and held.

The selection control unit 510 defines each level of the control signals Sa, Sb, Sc, and Sd corresponding to the nozzle according to the dot formation data of two bits latched according to the nozzle, a combination of the two bits, and the states St0 to St7, and outputs the defined result to the selection unit 520.

A table of FIG. 7 defines the drive signals W0 to W3 selected according to the combination of the dot formation data SI and further whether or not the selected drive signals W0 to W3 in the states St0 to St7 are supplied to the piezoelectric element Pzt, in the printing operation.

For example, in a case of (1, 1) where a higher bit SI-H is "1" and a lower bit SI-L is "1" among the dot formation data SI of two bits in a certain nozzle, the drive signal W3 is selected, and whether or not the drive signal is applied to the piezoelectric element Pzt corresponding to P03, P13, P23, P33, P43, P53, P63, and P73 of the waveform selection data SP, in each of the states St0 to St7, is defined.

Specifically, in a case where the drive signal W3 is selected, when P03, P13, P23, P33, P43, P53, P63, and P73 of the waveform selection data SP are sequentially "11110000", the drive signal W3 is applied to one end of the piezoelectric element Pzt in the states St0 to St3, and not applied to the one end of the piezoelectric element Pzt in the states St4 to St7.

If this is processed as selection signals Sa, Sb, Sc, and Sd, the selection control unit 510 processes the selection signal Sd as an H level in the states St0 to St3 and an L level in the states St4 to St7, and another selection signals Sa, Sb, and Sc as an L level during the printing cycle Ta (states St0 to St7).

A specific waveform of the drive signals W0 to W3 at the time of the printing operation will not be described in detail. However, the specific waveform is configured by combining representative unit waveforms as follows in the states St0 to St7.

Figure 12:
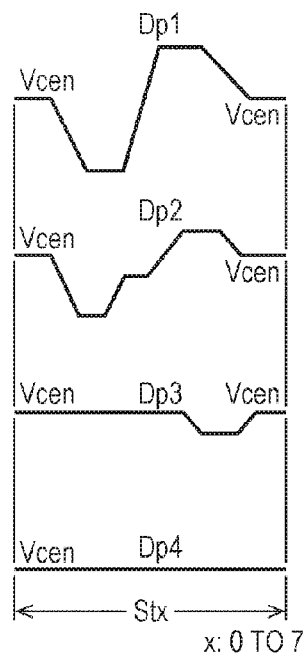
FIG. 12 is a diagram for explaining a waveform or the like of a drive signal.

FIG. 12 is an example of unit waveforms in the drive signal.

As illustrated in this drawing, a voltage at start timing of unit waveforms Dp1, Dp2, Dp3, and Dp4 and a voltage at end timing thereof are commonly a voltage Vcen. That is, each of the unit waveforms is a waveform of starting at the voltage Vcen, and finishing at the voltage Vcen, in each of the states.

The unit waveform Dp1 is a waveform for causing a predetermined amount, specifically, an intermediate amount of ink to be discharged from a nozzle N corresponding to the piezoelectric element Pzt, when the unit waveform Dp1 is applied to one end of the piezoelectric element Pzt.

The unit waveform Dp2 is a waveform for causing a small amount of ink to be discharged from a nozzle N corresponding to the piezoelectric element Pzt, when the unit waveform Dp2 is supplied to one end of the piezoelectric element Pzt, as known from that the amplitude is smaller than that of the unit waveform Dp1.

The unit waveform Dp4 does not cause ink to be discharged from a nozzle corresponding to the piezoelectric element Pzt, even when the unit waveform Dp4 is supplied to one end of the piezoelectric element Pzt because there is no change of the voltage. However, in a case where ink is not discharged from the nozzle N, there is a case where the viscosity of the ink increases and the increment becomes cause of abnormal discharge when only the unit waveform Dp4 is applied to the piezoelectric element Pzt.

Accordingly, the unit waveform Dp3 is prepared to suppress the increment of the viscosity of the ink without discharging the ink. That is, the unit waveform Dp3 is a waveform for not causing the ink to be discharged by suppressing increment of the viscosity by slightly vibrating ink in the vicinity of a nozzle N corresponding to the piezoelectric element Pzt, even when the unit waveform Dp3 is supplied to one end of the piezoelectric element Pzt.

The drive signal W0 is a waveform in which the unit waveforms Dp3 and Dp4 are repeated eight times corresponding to the states St0 to St7 during the printing cycle Ta because the dot formation data SI of the drive signal W0 is (0, 0) and, for example, selected in a case of defining non-discharge of the ink.

The drive signal W1 is a waveform in which the unit waveforms Dp3 (or Dp4) and Dp2 are appropriately combined during the printing cycle Ta because the dot formation data SI of the drive signal W1 is (0, 1) and, for example, selected in a case of defining formation of small dots.

The drive signal W2 is a waveform in which the unit waveforms Dp2 and Dp1 are appropriately combined during the printing cycle Ta, because the dot formation data SI of the drive signal W2 is (1, 0) and, for example, selected in a case of defining formation of medium dots.

Accordingly, the drive signal W3 is a waveform in which the unit waveform Dp1 is appropriately combined during the printing cycle Ta because the dot formation data SI of the drive signal W3 is (1, 1) and, for example, selected in a case of defining formation of large dots.

The drive signal is selected according to the dot formation data SI. However, as described above, it is defined whether or not the drive signal is applied by the waveform selection data SP without always applying the drive signal to the one end of the piezoelectric element Pzt in the states St0 to St7.

Next, operation at the time of inspecting a state of the discharge unit by determining the residual vibration will be described.

Figure 9:
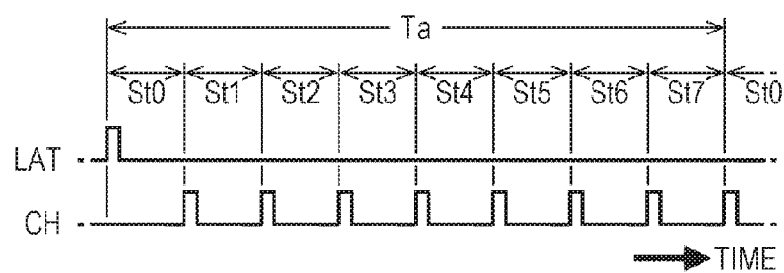
FIG. 9 is a diagram for explaining the content of the discharge control data.
Figure 10:
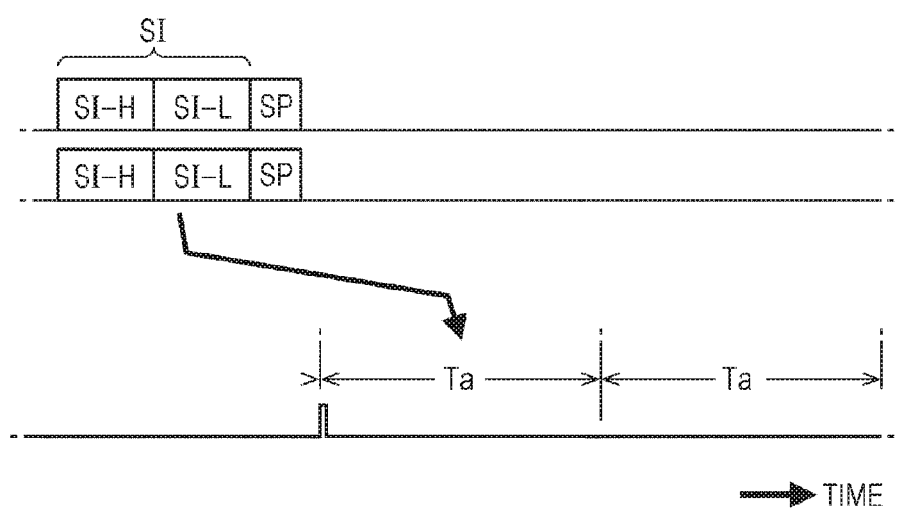
FIG. 10 is a diagram illustrating the transfer of the discharge control data.

FIG. 9 is a diagram for explaining the discharge control data, or the like at the time of the inspection, and FIG. 10 is a diagram illustrating transfer timing of the discharge control data output from the controller 110. FIG. 9 is different from FIG. 7 at the time of the printing operation in that the control signal LAT is only first supplied from the controller 110 at the time of the inspection and the control signals CH are supplied at the time of starting of the states St0 to St7.

Therefore, the discharge control data, as illustrated in FIG. 10, is supplied to the selection control unit 510 before the first control signal LAT and latched at the control signal LAT, and then the latched discharge control data is continuously used.

At the time of inspection, as illustrated in FIG. 9, for example, P71, P72, and P73 among the waveform selection data SP are replaced to the gain data Gt0, Gt1, and Gt2. The selection control unit 510 latches the gain data Gt0, Gt1, and Gt2, and supplies the latched gain data to the amplification unit 540.

Figure 11:
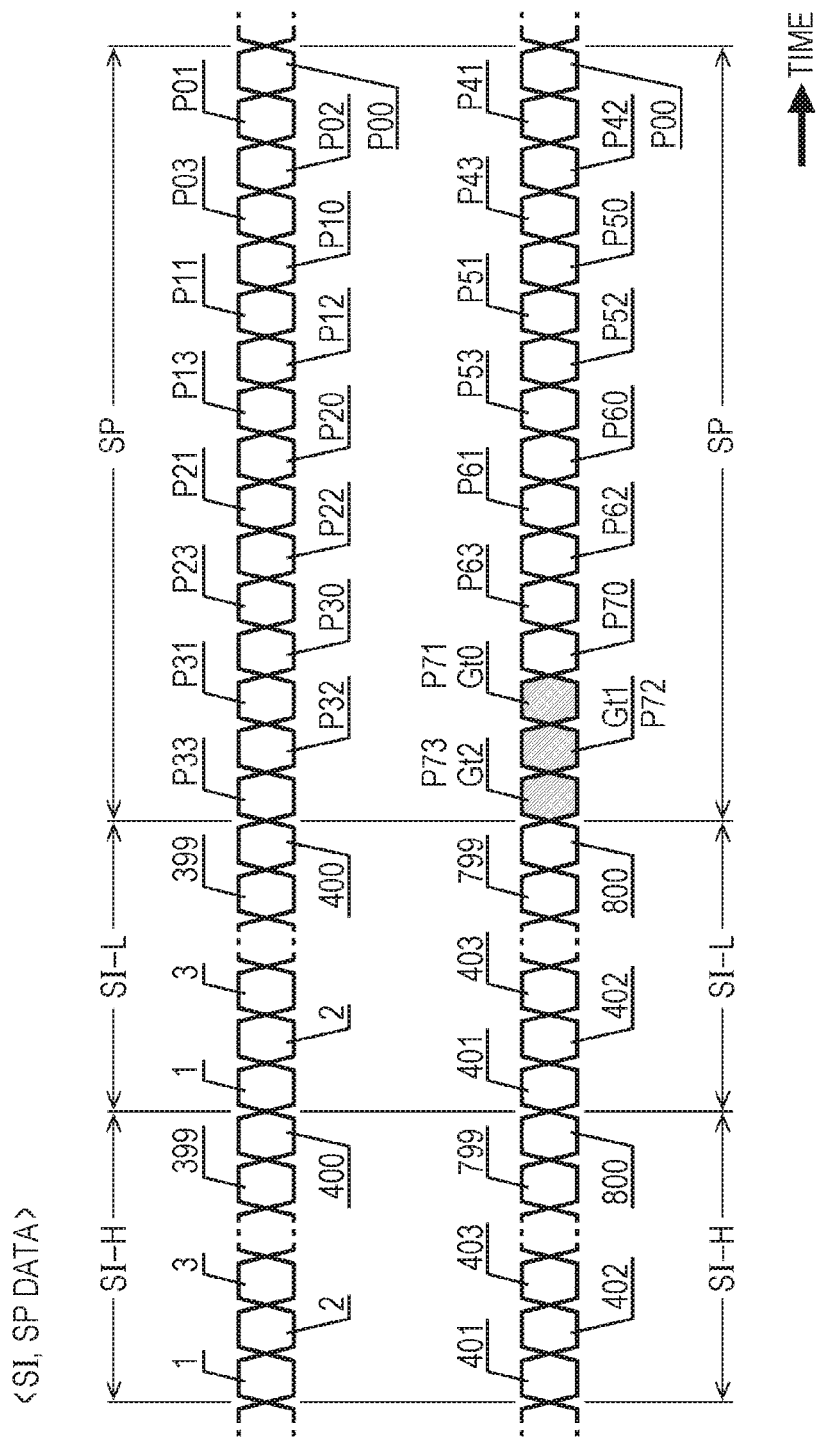
FIG. 11 is a diagram illustrating an example of a transfer order of the discharge control data.

FIG. 11 is a diagram illustrating an example of an order of the discharge control data when the controller 110 outputs the discharge control data to the selection control unit 510.

As described above, the discharge control data is supplied by being serialized in two lines. When an upper stage of the drawing is the first line and a lower stage thereof is the second line, the discharge control data is supplied in an order that, first, higher bits SI-H of the dot formation data corresponding to the nozzle number of "1" to "400", second, lower bits SI-L, and finally, 16 bits used in the states St0 to St3 among the waveform selection data SP, in the first line. In addition, the discharge control data is supplied in an order that first, higher bits SI-H of the dot formation data corresponding to the nozzle number of "401" to "800", second, lower bits SI-L, and finally, 16 bits used in the states St4 to St7 among the waveform selection data SP, in the second line.

At the time of the inspection, as described above, P71, P72, and P73 among the waveform selection data SP are replaced to the gain data Gt0, Gt1, and Gt2 at the time of the printing operation.

Figure 13:
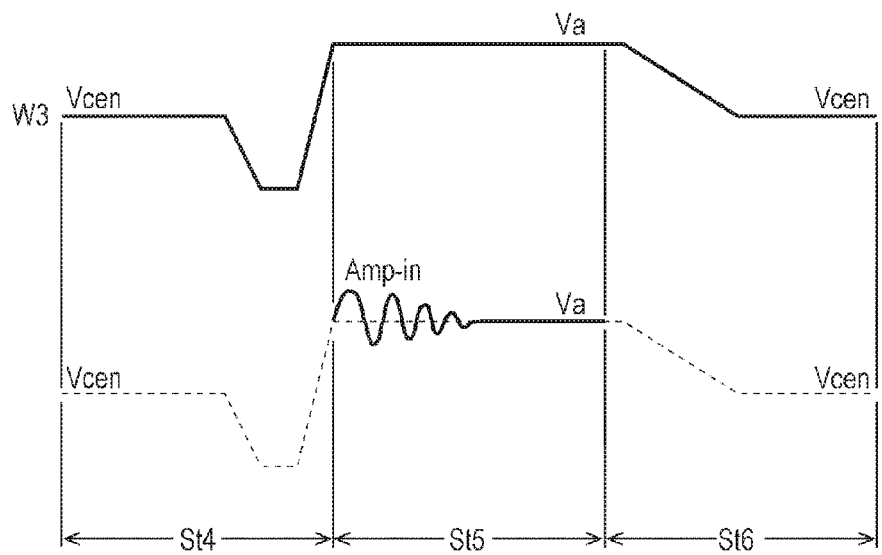
FIG. 13 is a diagram for explaining a waveform or the like of a residual vibration signal.

FIG. 13 is a diagram illustrating an example of a waveform of the drive signal used at the time of the inspection.

In this example, the drive signal W3 becomes a waveform as illustrated in the drawing when the drive signal W3 is used at the time of the inspection.

That is, the drive signal W3 is a waveform that descends from a voltage Vcen in the state St4, becomes flat, ascends up to a voltage Va at an end point of the state St4, maintains a voltage Va during the state St5, and returns to the voltage Vcen by descending from the voltage Va in the state St6.

Here, any one among the discharge units of 800 units becomes an inspection target. The controller 110 outputs the dot formation data SI of (1, 1) to the discharge unit (nozzle) of an inspection target, and outputs P43 being "1", P53 being "0", and P63 being "1" among the waveform selection data SP. In addition, the selection control unit 510 controls to turn on the selection unit 530 corresponding to the discharge unit of an inspection target during the state St5.

The drive signal W3 in the state St4 is applied to one end of the piezoelectric element Pzt of the discharge unit to be an inspection target. This is because that the transfer gate 524d corresponding to the discharge unit is turned on by "1" of P43 of the waveform selection data SP. The ink is input to the cavity 442 by flexing the piezoelectric element Pzt in an upward direction according to descending of a voltage by applying the drive signal W3, and then the ink is discharged from the nozzle N by flexing the piezoelectric element Pzt in a downward direction according to ascending of a voltage.

The drive signal W3 is maintained to a voltage Va during next state St5. However, one end of the piezoelectric element Pzt of the discharge unit to be an inspection target becomes electrically a high impedance state. This is because that the transfer gate 524d corresponding to the discharge unit is turned off by "0" of P53 of the waveform selection data SP.

Meanwhile, a part of the ink returns to the cavity 442 immediately after ink is discharged from the nozzle N in the discharge unit. In this case, ink having the viscosity remains while attenuating without immediately stopping vibration of the ink in the cavity 442. The vibration is referred to as the residual vibration.

In many cases, in a case where a voltage is applied from outside, the piezoelectric element Pzt functions as an actuator (part of discharge unit) displaced according to the voltage. However, in a case where displacement is applied from outside, the piezoelectric element Pzt functions as a residual vibration detection unit for outputting a voltage signal according to the displacement, that is, a residual vibration signal.

In the state St5, one end of the piezoelectric element Pzt corresponding to the discharge unit to be an inspection target is separated from the selection unit 520, and the other end thereof is maintained at the voltage $V_{BS}$. In addition, the selection unit 530 controls to turn on the discharge unit of an inspection target. Therefore, a voltage of the signal Amp-out supplied to an input terminal of the amplification unit 540 is a voltage of one end of the piezoelectric element Pzt, and becomes a voltage waveform according to the residual vibration at the cavity 442, as illustrated in FIG. 13.

The amplification unit 540 amplifies the signal Amp-in and outputs the amplified signal as the signal Amp-out, and the DAC 550 converts the signal Amp-out into digital data NsaD, and outputs the digital data to the determination unit 130.

The determination unit 130 analyzes the data NsaD and notifies the controller 110 of a state of the discharge unit to be an inspection target.

The inspection, for example, is performed by selecting the discharge units from "1" to "800" of the nozzle number, in a predetermined order. With this, it is possible to determine a state of the entirety of the discharge units in the head unit 3.

Next, the amplification unit 540 in which an amplification rate is set by the gain data Gt0 to Gt2 will be described.

Figure 14:
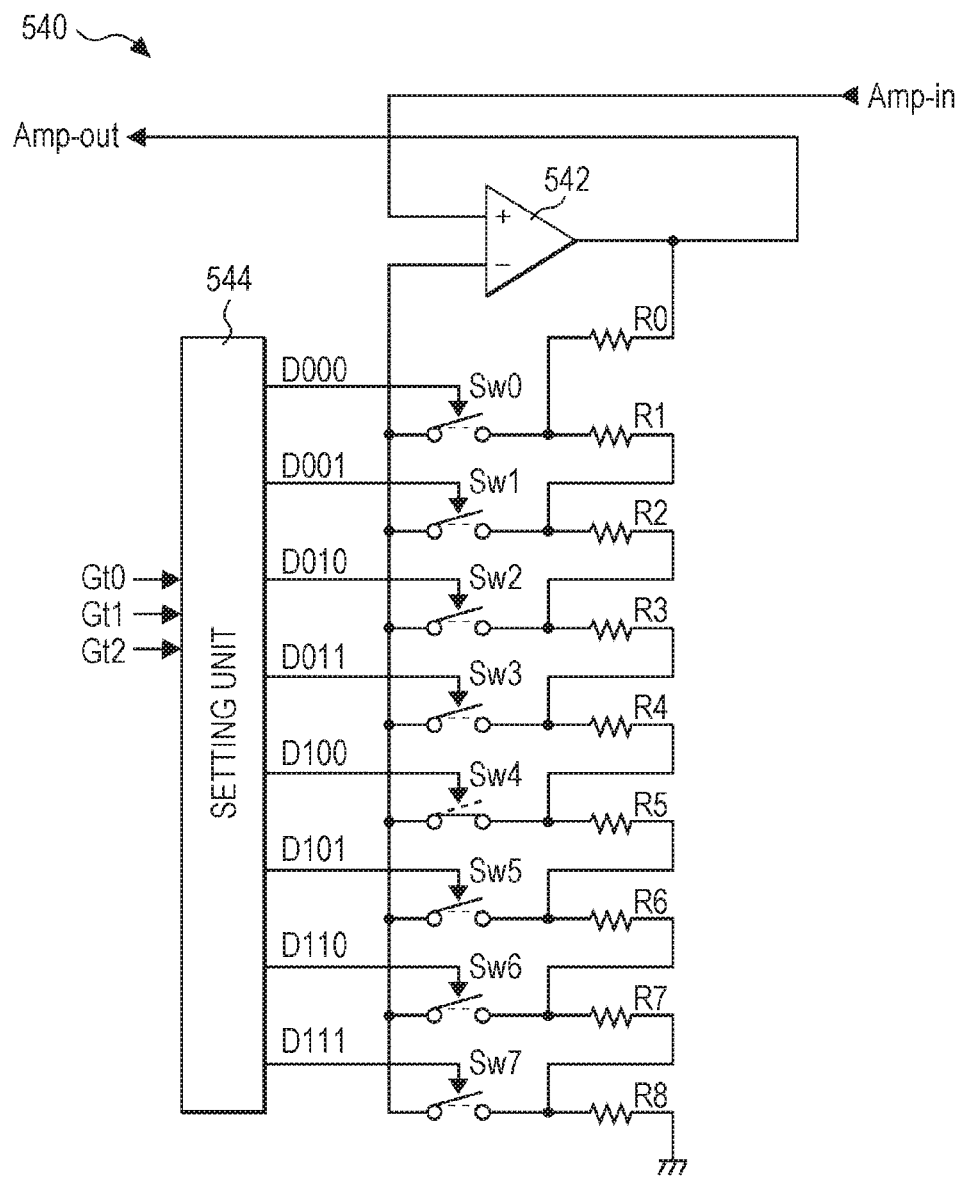
FIG. 14 is a diagram for explaining operation of an amplification unit.

FIG. 14 is a diagram illustrating a configuration of the amplification unit 540.

As illustrated in this drawing, the amplification unit 540 includes an operational amplifier 542, a setting unit 544, switches Sw0 to Sw7, and resistor elements R0 to R8.

The signal Amp-in input to the amplification unit 540 is supplied to a positive input terminal (+) of the operational amplifier 542. Meanwhile, the signal Amp-out is output from an output terminal of the operational amplifier 542.

One end of the resistor element R0 is connected to an output terminal of the operational amplifier 542, and the other end of the resistor element R0 is connected to one end of the switch Sw0 and one end of the resistor element R1. The other end of the resistor element R1 is connected to one end of the switch Sw1 and one end of the resistor element R2. In the same manner, the other end of the resistor element R7 is connected to one end of the switch Sw7 and one end of the resistor element R8. That is, in a case where i is an integer from 0 to 7, the other end of a resistor element Ri is connected to one end of a switch Swi and one end of a resistor element R(i+1). The other end of the resistor element R8 is connected to a constant potential, for example, the ground. Therefore, an output terminal of the operational amplifier 542 is connected to the ground through a series connection of the resistor elements R0 to R8.

Meanwhile, the other ends of the switches Sw0 to Sw7 are commonly connected to a negative input terminal (−) of the operational amplifier 542.

Here, the switch Sw0 is a switch that is turned on if a signal D000 output from a setting unit 544 is an H level, and turned off if the signal D000 is an L level, between one end and the other end thereof. Similarly, the switches Sw1 to Sw7 are controlled to be turned on or turned off by signals D001, D010, D011, D100, D101, D110, and D111 output from the setting unit 544.

The setting unit 544 decodes the gain data Gt0 to Gt2 supplied from the selection control unit 510 (see FIG. 5), and processes any one among eight signals D000, D001, D010, D011, D100, D101, D110, and D111 to an H level and others to an L level.

FIG. 15 is a diagram illustrating output states of the eight signals corresponding to the gain data Gt0 to Gt2 in the setting unit 544. For example, the setting unit 544 processes only a signal D100 as an H level if the gain data from Gt0 is (1, 0, 0) in order.

When only one among the eight signals output from the setting unit 544 becomes an H level, only any one of the switches Sw0 to Sw7 is turned on and others are turned off. When only one among the switches Sw0 to Sw7 is turned on, only any one of connection points of the resistor elements among the resistor elements R0 to R8 is fed back to the negative input terminal (−) of the operational amplifier 542 through a switch turned on.

Figure 16:
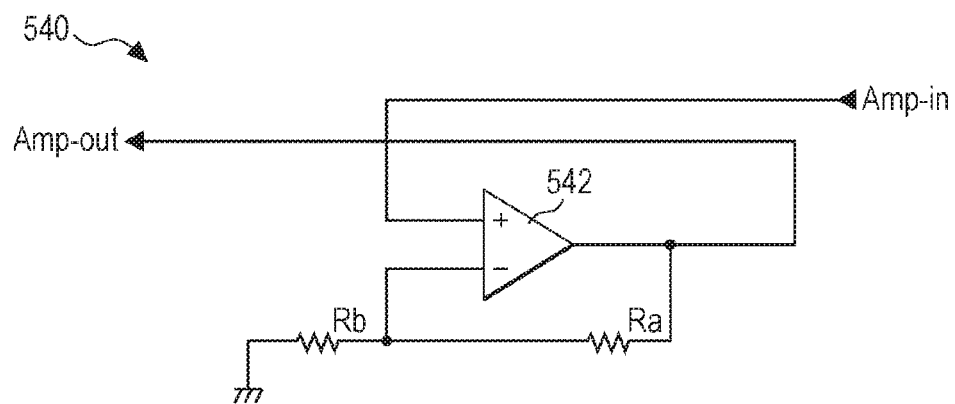
FIG. 16 is a diagram illustrating operation of the amplification unit.

FIG. 16 is a diagram illustrating an equivalent circuit in the vicinity of the operational amplifier 542 in the amplification unit 540.

As illustrated in this drawing, an output terminal of the operational amplifier 542 is connected to the ground through a series connection of a resistor Ra (first resistor) and a resistor Rb (second resistor), and a connection point between the resistors Ra and Rb is fed back to the negative input terminal (−) of the operational amplifier 542.

Therefore, an amplification rate G by the amplification unit 540, that is, a ratio of a voltage of the signal Amp-out with respect to a voltage of the signal Amp-in can be represented as the following equation.

$$G=1+(Ra/Rb)$$

Here, the resistor Ra is a series resistor component from an output terminal of the operational amplifier 542 to one end of a switch turned on, among the resistors R0 to R8, and the resistor Rb is a series resistor component from one end of a switch turned on to the ground, among the resistors R0 to R8.

The resistors Ra and Rb with respect to eight states defined by the gain data Gt0 to Gt2 are configured as illustrated in FIG. 16. In the above example, if the gain data is (1, 0, 0), since only the signal D100 becomes an H level, the resistor Ra becomes a series resistor component from R0 to R4, and the resistor Rb becomes a series resistor component from R5 to R8.

Figure 17:
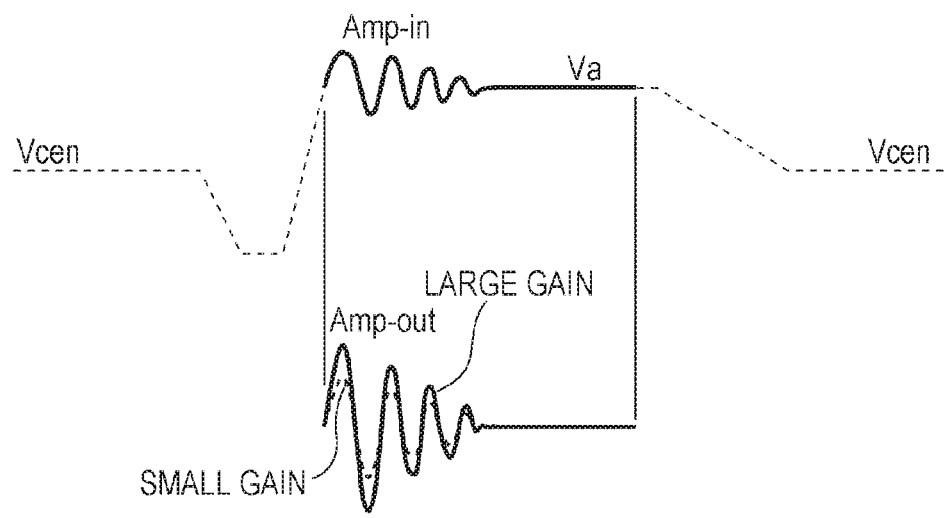
FIG. 17 is a diagram illustrating an example of input and output of the amplification unit.

According to the amplification unit 540, an amplification rate is changed in eight stages in accordance with the gain data Gt0 to Gt2. Specifically, as illustrated in FIG. 17, the signal Amp-out for the signal Amp-in is represented as a solid line, in a case where the amplification rate is comparatively large. Meanwhile the signal Amp-out for the signal Amp-in is represented as a dashed line, in a case where the amplification rate is comparatively small.

Since the gain data Gt0 to Gt2 is determined according to temperature and viscosity of ink in the controller 110, it is possible to amplify the residual vibration signal with an appropriate amplification rate with respect to the temperature and viscosity of ink. Accordingly, it is possible to accurately determine a state of the discharge unit under various conditions.

In addition, the gain data Gt0 to Gt2 is transferred, as a part of the waveform selection data SP, from the controller 110 in the control unit 100 to the drive IC 50 in the head unit 3. Therefore, it is not required that a new wiring path is added to an FFC 190.

Application And Modification Examples

The invention is not limited to above-described embodiment, and for example, can implement various applications and modifications described below. An aspect of the various applications and modifications described below can appropriately be combined by one or a plurality of combinations arbitrarily selected.

In the embodiment, the determination unit 130 analyzes the data NsaD by FFT, or the like, and determines a state of the discharge unit. However, time information can be lost in the FFT. Therefore, for example, processing of leaving also the time information, such as wavelet transform rather than the FFT, may be performed.

The gain data may be output by replacing a part of the dot formation data SI, rather than being output by replacing a part of the waveform selection data SP. For example, in a case where a dummy nozzle which can not discharge ink to the actuator substrate 40 is provided, dot formation data of the dummy nozzle has no significance. Meanwhile, it is preferable that the drive IC 50 can be commonly used in the actuator substrate 40 in which the dummy nozzle is not provided, and in the actuator substrate in which the dummy nozzle is provided, in view of suppressing costs. Therefore, in a case where the dummy nozzle exists, the controller 110 outputs dummy dot formation data corresponding to the dummy nozzle, in the related art. The dummy dot formation data is replaced to the gain data.

In addition, a part of the waveform selection data SP and a part of the dot formation data SI may be replaced by the gain data.

Furthermore, the gain data may be supplied to the drive IC 50 through a separate, dedicated wiring different from a wiring through which the discharge control data is supplied.

In addition, the gain data is not limited to 3 bits (eight stages in amplification rate of amplification unit 540). For example, the gain data may be equal to or greater than four bits (16 stages), and one bit (2 stages) or two bits (4 stages).

The dot formation data SI and the waveform selection data SP may be provided spaced apart in time rather than continuous data, in the discharge control data, or may be interchanged with each other in a temporal order.

In addition, detection of the residual vibration and state determination of a detection unit are separately performed with the printing operation. However, a configuration in which detection of the residual vibration state and determination of a detection unit are performed with respect to a nozzle that does not discharge ink at the time of the printing operation may be implemented. Since it is not preferable that ink is discharged from a nozzle of an inspection target in the configuration, the residual vibration may be detected by applying a waveform such as a unit waveform Dp3 for preventing the thickening to the piezoelectric element Pzt of a nozzle to be an inspection target.

The controller 110 outputs gain data with both the temperature data TD and the ink information InkD as arguments. However, the controller 110 may use any one of the temperature data TD and the ink information InkD as arguments. That is, the controller 110 may output the gain data according to only temperature indicated by the temperature data TD, or output the gain data according to only the viscosity of ink defined in the ink information InkD.

The determination unit 130 may be configured to be incorporated with the drive IC 50 instead of the control unit 100. In addition, the drive IC 50 may have a function for simple determination. The control unit 100 side may have a function for a more precise determination.

There is a tendency of characteristics to be deteriorated by aging in the piezoelectric element Pzt. Therefore, when an amplification rate of the amplification unit 540 is fixed, there is a case where the residual vibration is not correctly determined. Accordingly, a usage period of the head is calculated from the number of times of discharge, an accumulated time of being powered on, and the like, and an amplification rate may be changed according to the usage period. Specifically, a configuration in which the amplification rate increases by lengthening the usage period may be implemented.

The embodiment is configured to transfer the gain data from the control unit 100 side. However, a configuration in which a memory for storing the gain data is provided in the head unit 3 side and an amplification rate of the amplification unit 540 is defined by the gain data held in the memory, may be implemented. A configuration in which an amplification rate is changed in a case where the gain data held in the memory is rewritten, may be implemented.

In addition, the embodiment is configured to provide the DAC 550 in the head unit 3 and convert the signal Amp-out into digital data NsaD at a side of the head unit 3. However, a configuration in which a function of the DAC is provided in the control unit 100 and the signal Amp-out is converted into the digital data NsaD at a side of the control unit 100, may be implemented.

What is claimed is:

1. A liquid discharge apparatus comprising:
a controller;
a drive signal generation unit;
a discharge unit;
a residual vibration detection unit; and
an amplification unit,
wherein the controller generates a discharge control data for controlling discharge of liquid and a gain data for controlling an amplification rate of the amplification unit,
wherein the drive signal generation unit generates and outputs a drive signal including a plurality of waveforms driving the discharge unit based on the discharge control data,
wherein the discharge unit discharges the liquid by applying a waveform assigned by the discharge control data among the plurality of waveforms included in the drive signal,
wherein the residual vibration detection unit detects residual vibration of the discharge unit and outputs a residual vibration signal indicating the residual vibration, after the discharge unit is driven by the drive signal,
wherein the amplification unit amplifies the residual vibration signal in accordance with the amplification rate determined based on the gain data from the controller and outputs the amplified signal, and
wherein the controller generates the gain data according to a type of the liquid discharged from the discharge unit.

2. The liquid discharge apparatus according to claim 1, wherein the amplification unit includes
an operational amplifier that amplifies the residual vibration signal based on the amplification rate and according to a resistor ratio of a first resistor and a second resistor, and
a setting unit that sets the resistor ratio based on the gain data from the controller.

3. The liquid discharge apparatus according to claim 2, wherein each of the first resistor and the second resistor includes a plurality of resistor elements, and
wherein the setting unit sets the resistor ratio by changing the number of resistor elements included in at least one of the first resistor and the second resistor.

4. The liquid discharge apparatus according to claim 2, further comprising:
a temperature measurement unit that measures temperature of a head unit,
wherein the controller generates the gain data according to temperature measured in the temperature measurement unit.

5. A method for controlling a liquid discharge apparatus including a controller, a drive signal generation unit, a discharge unit, a residual vibration detection unit, and an amplification unit, the method comprising:

causing the controller to generate a discharge control data for controlling discharge of liquid and a gain data for controlling an amplification rate of the amplification unit;
causing the drive signal generation unit to generate and output a drive signal including a plurality of waveforms driving the discharge unit;
causing the discharge unit to discharge the liquid by applying a waveform assigned by the discharge control data among the plurality of waveforms included in the drive signal;
causing the residual vibration detection unit to detect residual vibration of the discharge unit and output a residual vibration signal indicating the residual vibration, after the discharge unit is driven by the drive signal;
causing the amplification unit to adjust the amplification rate based on the gain data, to amplify the residual vibration signal with the amplification rate controlled by the controller, and to output the amplified signal; and
causing the controller to generate the gain data according to a type of the liquid discharged from the discharge unit.

\* \* \* \* \*